United States Patent
Goela et al.

(10) Patent No.: US 6,228,297 B1
(45) Date of Patent: May 8, 2001

(54) METHOD FOR PRODUCING FREE-STANDING SILICON CARBIDE ARTICLES

(75) Inventors: Jitendra Singh Goela, Andover; Michael A. Pickering, Dracut, both of MA (US)

(73) Assignee: Rohm and Haas Company, Philadelphia, PA (US)

(*) Notice: Subject to any disclaimer, the term of this patent is extended or adjusted under 35 U.S.C. 154(b) by 0 days.

(21) Appl. No.: 09/072,927

(22) Filed: May 5, 1998

(51) Int. Cl.[7] .................................................. B29C 67/00
(52) U.S. Cl. ............................................ 264/81; 264/334
(58) Field of Search ........................................ 264/81, 334

(56) References Cited

U.S. PATENT DOCUMENTS

| | | | |
|---|---|---|---|
| 4,963,393 | 10/1990 | Goela et al. | 427/248.1 |
| 4,990,374 | 2/1991 | Keeley et al. | 427/255.1 |
| 4,997,678 | 3/1991 | Taylor et al. | 427/249 |
| 5,071,596 | 12/1991 | Goela et al. | 264/1.2 |
| 5,374,412 | 12/1994 | Pickering et al. | 423/346 |
| 5,683,028 | 11/1997 | Goela et al. | 228/121 |
| 5,683,507 | 11/1997 | Barrett et al. | |

OTHER PUBLICATIONS

Geril, N. et al., "Thin Shell Replication of Grazing Incident (Wolter Type I) SiC Mirrors", SPIE Proc., 2478, 215 (1995) (Reprint of article without page numbers).

Goela et al. "Optics applications of Chemical Vapor Deposited B–SiC" in Critical Reviews of Optical Science and Technology, vol. CR67, S. Photo–Optical Instrumentation Eng. Bellingham, Wash., pp. 71–104, Jul. 1997.

*Primary Examiner*—Christopher A. Fiorilla

(57) ABSTRACT

A process of producing relatively large, dense, free-standing silicon carbide articles by chemical vapor deposition is enabled by the provision of specially designed isolation devices. These devices segregate silicon carbide deposits on the intended portions of substrates, thereby alleviating the need to fracture heavy silicon carbide deposits in order to remove, or otherwise move, the substrate, with the heavy deposit thereon, from the deposition furnace. The isolation devices enable the use of more efficient vertically extended vacuum furnaces. The isolation devices also enable the commercial production of relatively dense, large, thin-walled, silicon carbide shells.

19 Claims, 2 Drawing Sheets

METHOD FOR PRODUCING FREE-STANDING SILICON CARBIDE ARTICLES

BACKGROUND OF THE INVENTION

1. Field of the Invention

Silicon carbide's unique combination of properties make it a particularly suitable material for a variety of applications in the semiconductor, optical, electronic and chemical processing fields. Moreover, chemical vapor deposition (CVD) techniques have been widely used to provide thin films and coatings of a variety of materials on various articles. Silicon carbide articles produced by chemical vapor deposition (CVD) processing are recognized to exhibit superior mechanical, thermal, physical and optical properties. This invention is directed to improvements in a CVD process of producing free standing, self-supporting silicon carbide articles, and is particularly adapted to the production of hollow shells of cylindrical, frustoconical or other shapes. Such shells can be used in x-ray telescopes, semiconductor processing furnaces, heat exchangers, laser tubes and chemical process equipment.

2. Description of Related Art

The advantages of silicon carbide as a fabrication material for astronomical X-ray telescopes and the experimental use of small scale CVD processing to prepare conical silicon carbide shells was recently described by Geril et al. in "Thin Shell Replication of Grazing Incident (Wolter Type I) SiC Mirrors", SPIE Proc., 2478, 215 (1995).

The advantages of CVD produced free-standing silicon carbide materials in applications requiring a high degree of surface smoothness and polishability are described in U.S. Pat. No. 5,374,412. The patent describes apparatus and process conditions which are used in the CVD production of free-standing silicon carbide articles. This patent also refers to earlier U.S. Pat. Nos. 4,990,374; 4,997,678 and 5,071,596 as further describing CVD processes of producing free-standing silicon carbide materials by the pyrolytic deposit of SiC on a mandrel.

Several methods of controlling or isolating the deposit of silicon carbide to the intended side of the substrate during chemical vapor deposition are described in U.S. Pat. Nos. 4,963,393 and 4,990,374. In U.S. Pat. No. 4,963,393, a curtain of a flexible graphite cloth is arranged to shield the backside of the substrate from the flowing reacted precursor gases, whereby silicon carbide deposits on the backside of the substrate are avoided. In U.S. Pat. No. 4,990,374 a counterflow of a non-reactive gas is directed to flow past the substrate's peripheral edge from behind the substrate whereby the deposit is confined to the front face of the substrate.

SUMMARY OF THE INVENTION

Chemical vapor deposition (CVD) has been used to produce both free-standing articles and coatings of silicon carbide. Typically, the process involves reacting vaporized or gaseous chemical precursors in the vicinity of a substrate to result in silicon carbide depositing on the substrate. The deposition reaction is continued until the deposit reaches the desired thickness. If a coated article is desired, the substrate is the article to be coated and the coating is relatively thin. If a free-standing article or silicon carbide bulk material is desired, a thicker deposit is formed as a shell on the substrate and then separated from the substrate to provide the silicon carbide article.

In a typical silicon carbide bulk material production run, silicon carbide precursor gases or vapors are fed to a deposition chamber where they are heated to a temperature at which they react to produce silicon carbide. The silicon carbide deposits as a shell on a solid mandrel or other substrate provided in the deposition chamber. The deposition is continued until the desired thickness of silicon carbide is deposited on the substrate, or mandrel. The mandrel is then removed from the deposition chamber and the shell is separated from the mandrel. Monolithic silicon carbide plates and cylinders have been produced by applying such chemical vapor deposition (CVD) techniques with suitably shaped substrate or mandrel forms.

Once the silicon carbide precursor gases or vapors are brought to the appropriate conditions to cause them to react, they produce silicon carbide which then deposits on any available surface. The deposit generally is not limited to the intended surface(s) of the mandrel(s) and generally extends past such surfaces to adjoining surfaces as well as depositing on the walls and housing of the deposition chamber. In the past, the silicon carbide deposit has extended past the dimensional limits of the mandrel over adjacent portions of the support structure holding or supporting the mandrel in its position in the deposition chamber. It is then necessary to fracture such deposits to remove the mandrel from the deposition chamber. Fracturing of the deposit often results in the formation of cracks which propagate through the deposit from the point of fracture. Such cracks are not acceptable in the intended applications of the silicon carbide articles, and usually result in the article being rejected. The prevalence of propagated cracks in relatively thick chemical vapor deposits of silicon carbide have limited the size of articles that can be produced commercially by this method. Moreover, recognition of the potential capacity of CVD silicon carbide deposits to bridge any joints between adjacent stacked mandrels and the subsequent difficulty of separating and removing individual mandrels from such a stack has prevented the use of stacked mandrels in the commercial production of silicon carbide articles.

Optimal deposition conditions generally require less than atmospheric pressures, which requires that the deposition be conducted in a vacuum chamber. It is generally less expensive to increase the production volume of vacuum chambers by increasing their vertical dimensions rather than increasing their horizontal, or floor space occupying, dimensions. Accordingly, it would be economically advantageous to provide a commercial technique for creating silicon carbide deposits on a plurality of mandrels, wherein the mandrels are vertically stacked within a single vertically extending deposition chamber. This, however, has not been done in the past, at least in part because of the difficulty in segregating, or isolating, the deposit on one mandrel from the deposit produced on an adjoining mandrel.

The present invention is directed to a process, and associated apparatus, which greatly restricts and, preferably, completely avoids, the formation of deposits extending past the dimensional limits of the mandrel. By limiting, or avoiding, the formation of such deposits, removal of the mandrel from the deposition chamber does not result in cracks which propagate through the deposit. When practice of the invention avoids the formation of a deposit at or adjacent the dimensional boundary of the mandrel, the mandrel can be removed from the deposition chamber without fracturing the deposit. When a greatly restricted deposit forms at the dimensional boundary of the mandrel, it forms a thin coating, substantially thinner than the main body of the deposit, the fracture of which does not result in cracks extending into the main body of the deposit.

The present invention also provides a process wherein silicon carbide deposits are formed on a plurality of substrates, or mandrels, as they are arranged in a vertical stack, one atop another. The mandrels are then removed from the stack and the deposits separated from the mandrels to result in free-standing dense silicon carbide articles.

The invention further provides for the production of rigid, thin-walled cylindrical or frustroconical shells of dense silicon carbide having an aspect ratio, i.e., the ratio of the shell diameter to its wall thickness, of 50 or greater. It also has permitted the commercial production of large diameter, i.e. 18 inch diameter and greater, cylindrical or frustoconical shells of dense silicon carbide.

DETAILED DESCRIPTION OF THE INVENTION

Figure 1:
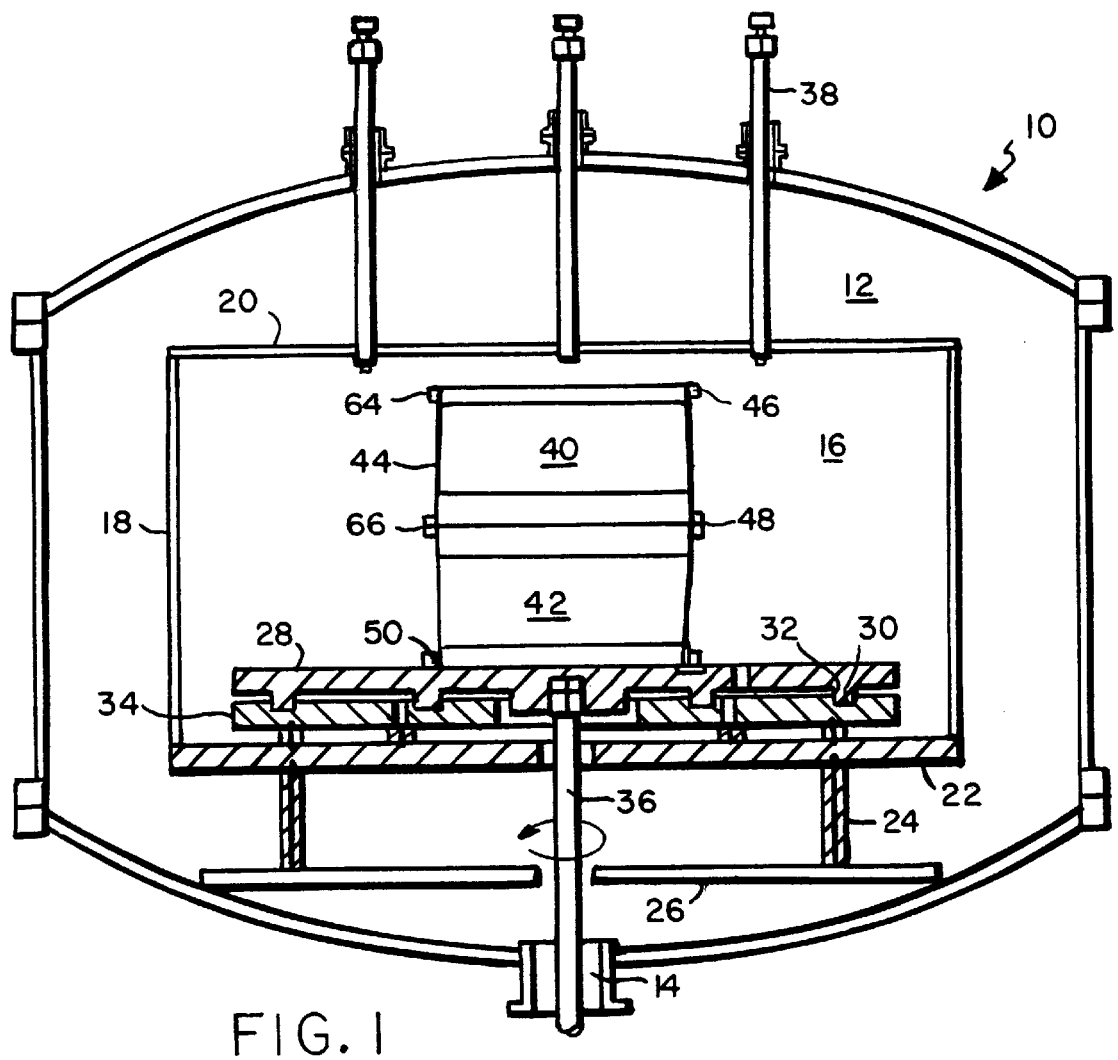
FIG. 1 is a schematic illustration, partially in section, of a furnace utilizing the process and apparatus of the present invention to produce an inventive relatively dense, thin-walled, large silicon carbide shell.

A chemical vapor deposition (CVD) furnace equipped for producing silicon carbide shells according to the present invention is illustrated in FIG. 1. The furnace 10 includes an outer housing defining a vacuum chamber 12, which is connected to a vacuum source through exhaust port 14. A deposition chamber 16, provided in the vacuum chamber, is defined by side wall 18, top wall 20 and base 22. The base 22 is supported by columns 24 extending up from a floor plate 26 provided near the bottom of the vacuum chamber 12. A rotating platform 28 is supported by rails 30 which extend into channels 32 on table 34. Shaft 36 transmits a motive force to rotate the platform 28 from a motor/transmission system (not shown). An arrangement of gas injectors 38 feed the deposit precursor gases through the top wall 20 into the deposition chamber 16. Typically, the arrangement of injectors 38 involves multiple injectors arranged around a central injector. A stack of two mandrels 40 and 42 is arranged on the rotating platform. Each of the mandrels comprise a side wall 44 formed from a hollow conical graphite form which extends from a small end 46 to a large end 48. The diameter of the mandrel at the small end 46 is less than the diameter at its large end 48. As arranged in FIG. 1, the mandrels are stacked with their large ends 48 adjacent each other. Suitable heating means (not illustrated) provide the desired deposition temperature at the mandrel surface. Graphite electrical resistance heaters arranged along the side wall and beneath the bottom of the mandrels have provided relatively uniform temperature distribution over the mandrel surface.

In a typical silicon carbide production run, a single mandrel 42 is located on the rotating platform 28, the deposition chamber 16 assembled and the vacuum chamber 12 closed. The vacuum chamber is purged of atmospheric gases by drawing a vacuum on the chamber, injecting an inert gas through the gas injectors 38, and redrawing a vacuum. These steps are repeated until the atmospheric gases are adequately purged. The rotation of the platform 28 is then initiated, the mandrels heated to the target deposition temperature, the flow of reactive coating precursor gas initiated and the target furnace pressure established. The flow of precursor gas, the target mandrel temperature and the target furnace pressure are continued until the deposit reaches the desired thickness, at which time the flow of coating precursor gas is discontinued, and the mandrel temperature and furnace pressure allowed to return to normal, or ambient. The vacuum chamber is then opened (usually from the bottom), the rotating platform lowered, and the mandrel removed therefrom. The silicon carbide deposit is then separated and recovered from the mandrel. In the past, removal of the mandrel from the rotating platform was complicated by the silicon carbide deposit which not only formed on the mandrel, but extended past the end of the mandrel along the top surface of the rotating platform 28. Removal of the mandrel required fracturing this relatively thick deposit which created cracks, which, in turn, could propagate from the point of fracture throughout the deposit, in many cases precluding the use of the silicon carbide article for its intended use.

Figure 2:
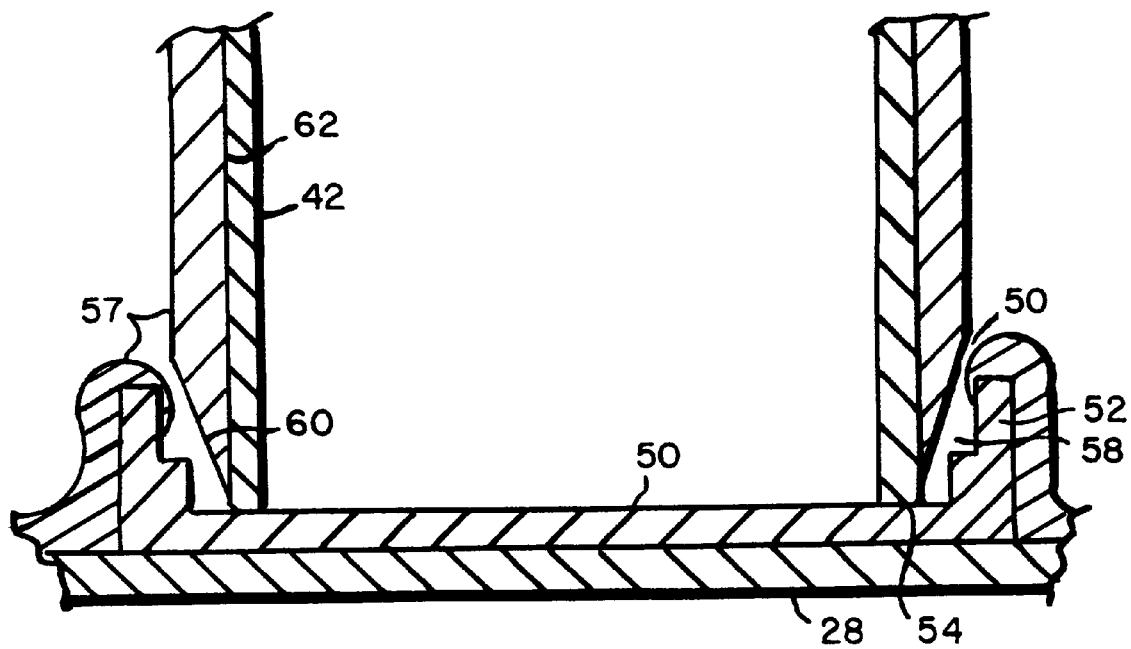
FIG. 2 is a cross section of one type of isolation device according to the present invention, deployed in the CVD furnace with a deposit on a mandrel substrate.
Figure 3:
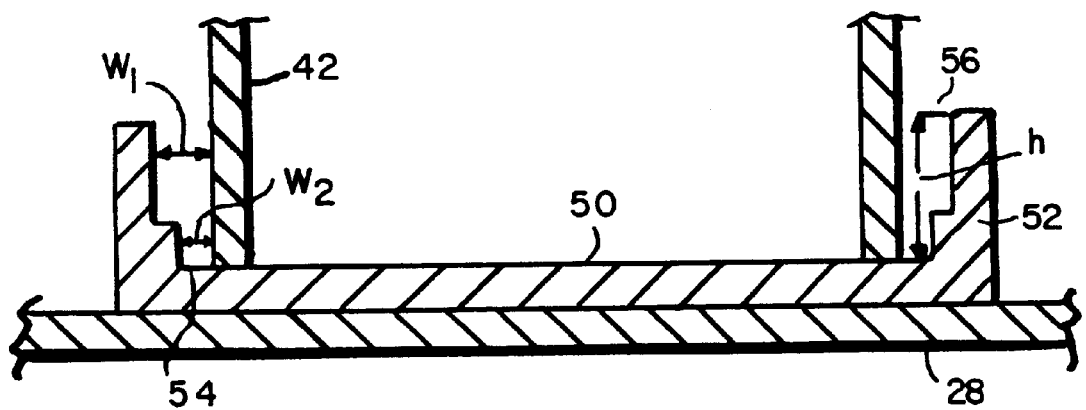
FIG. 3 is a further cross section of the mandrel and isolation device illustrated in FIG. 2.

In the present process an isolation device 50 is provided between the bottom mandrel 42 and the rotating platform 28. As best seen in FIG. 2, the isolation device 50 includes a side or outer wall portion 52 and a closed end portion 54. The outer wall portion 52 is spaced from the mandrel 42 and extends from the closed end portion 54 to an open end 56. The closed end portion extends between the mandrel 42 and the outer wall portion 52. Together, the outer wall portion 52, the closed end portion 54 and the mandrel 42 define an open channel 58 which extends from the closed end to the open end 56. As best seen in FIG. 3, at its open end 56, the width of the open channel, $w_1$, or the distance between the outer wall portion 52 and the mandrel 42, is one to two times the intended thickness of the final silicon carbide deposit 57. Preferably, the width of the channel, $w_2$, at the closed end 54 is less than ½ of the width $w_1$. The provision of a smaller channel width, $w_2$, at the closed end assures that no deposit will form on the mandrel where it adjoins the closed end 54. The height, h, of the open channel 58 from the closed end 54 to the open end 56 is greater than the width $w_1$, and, preferably, is approximately 1.5 to 5 times the width $w_1$.

The open channel 58 defines a boundary zone 60 on that portion of the surface of the mandrel, or substrate, which lies adjacent the open channel, i.e. that portion of the mandrel extending beneath the outer wall portion 52 of the isolation device 50. The boundary zone is distinguished from the remaining portion of the mandrel surface, which portion is referred to as the deposition zone 62, by its diminished availability to the reacting coating precursor gases, resulting in the formation of a substantially thinner silicon carbide deposit in the boundary zone. The deposit thickness within the boundary zone decreases the further it is from the channel's open end 56. Preferably, the deposit thickness decreases sufficiently that essentially no deposit is formed adjacent the closed end 54 of the channel.

Utilization of the isolation device 50 between the mandrel 42 and the platform 28 in the inventive process provides a boundary zone 60 of diminished deposit thickness between the deposition zone 62 and that portion of the mandrel which is most proximate the supporting solid surface of the rotating platform 28. Preferably, the deposit thickness diminishes to essentially zero at the end of the mandrel most proximate to the platform 28. Accordingly, removal of the mandrel 42 with the silicon carbide deposit thereon from the isolation device 50 does not require fracturing a thick extension of the deposit and the accompanying possibility of creating propagating cracks in the product article. The yield of acceptable product is thereby substantially enhanced by minimizing or eliminating the silicon carbide deposit where the removable mandrel adjoins non-removable components of the furnace.

An isolation device 64, which is essentially identical to the isolation device 50, is provided at the top of the upper mandrel 40 where it serves to prevent the silicon carbide deposit from extending over the upper rim and onto the interior surface of the hollow upper mandrel 40. The closed end portion of isolation device 64, like that of device 50, is a dish-like continuous solid sheet spanning the space defined by the outer wall. Accordingly, the isolation device 64 also functions to essentially close the upper end of the stack thereby denying the reactive precursor gases access to the interior of the stack of hollow mandrels 40 and 42 and avoiding unwanted deposits forming on the interior surfaces of the hollow mandrels.

Figure 4:
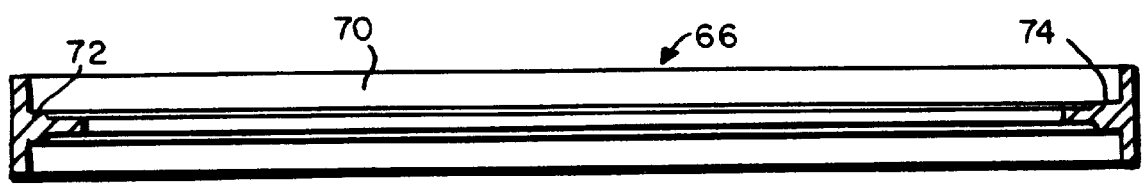
FIG. 4 is a cross section of a further type of isolation device according to the present invention.

A further isolation device 66 is provided between the stacked mandrels 40 and 42. The isolation devices 50 and 64 are designed to cooperate with a single mandrel in defining a boundary zone adjacent the periphery of such mandrel. Isolation device 66 is designed to cooperate with two stacked mandrels in providing isolation zones on each. As seen best in FIG. 4, isolation device 66 comprises a circular ring comprising a circumferentially extending outer wall portion 70 with a radially disposed closed end portion 72 extending inwardly from the center of the inner face of the outer wall portion so as to result in the ring having a generally T-shaped cross-section. As deployed, the radially disposed closed end portion 72 is located on top of the upper edge of the lower mandrel 42 and the lower edge of the upper mandrel 40 is located on top of the closed end portion 72. The circumferentially extending outer wall portion 70 extends around both lower and upper mandrels functioning with each of them and the closed end portion 72 to define boundary zones 60 at each of the mandrels' adjoining edges. During the deposition process the isolation device restricts the flow of reacting precursor gases to these boundary zones whereby the thickness of the deposit formed in each of the boundary zones gradually decreases, preferably to zero, as the deposit approaches the closed end. Since the deposit is essentially completed before reaching the closed end and does not extend across the junction of the mandrel with the isolation device, the separation of the mandrel from the isolation device at the completion of the run does not produce cracks which propagate throughout the deposit. In the isolation device illustrated in FIG. 4, the radially disposed closed end portion 72 is sufficiently long to be fully supported by the lower mandrel 42 and to provide full support for the upper mandrel 40, but does not extend from one side to the other, as do the illustrated isolation devices 50 and 64. While the device 66 could be designed to completely isolate the interiors of the adjacent mandrels, a savings in weight, material and cost is achieved by providing a device 66 with the illustrated annular closed end portion 72. The closed end portion of device 66 is thicker adjacent its outer end portion 70 than it is where it contacts the mandrel. The change in thickness occurs at a step 74 located at a diameter equal to the external diameter of the associated mandrel plus two times the intended $w_2$ dimension, i.e. the intended width at the closed end of the channel.

One of ordinary skill will recognize that the upper and lower mandrels may have differing length, width and thickness dimensions. The dimensions of the isolation devices can be readily determined from the dimensions of the particular mandrels to be isolated.

A vertical stack of two mandrels is illustrated in the FIG. 1 embodiment. The stack can include 4, 6, or any number of mandrels, provided they are separated with isolation devices at each junction. The capability of processing multiple mandrels in a vertical stack enables the process to be conducted in vertically oriented vacuum furnaces which generally require less floor space, less capital and less maintenance expense than horizontally oriented vacuum furnaces of the same capacity.

The substrates, or mandrels, are typically shaped around hollow cores to minimize their cost and weight. The mandrels can have generally circular or annular cross-sections, as in cylindrical or frustroconical mandrels. Moreover, the mandrels may incorporate several distinct shapes as they extend along their axial lengths. Double frustroconical shaped mandrels in which two cones having different side wall angles converge in the middle portion of the mandrel have been used. Alternatively, when flat sheets of silicon carbide are to be produced, the mandrel may comprise a series of connected planar walls extending around a hollow core, like the four side walls of a box.

The mandrels are fabricated from appropriate high temperature materials such as alumina, graphite, molybdenum or tungsten. Graphite is generally preferred because of its close thermal expansion match with silicon carbide, its high temperature properties and its availability in large sizes. The SiC-12 grade of graphite produced by Toyo Tanzo Inc. is particularly preferred when the deposit is formed on the exterior or peripheral surface of the mandrel. The thermal expansion coefficient of this grade of graphite is just slightly greater than silicon carbide's coefficient, assuring that the mandrel will shrink slightly more than the deposit during cool down. When graphite mandrels are used, separation of the deposit from the mandrel is usually accomplished by combustion of, or burning away, the graphite at a temperature between 600° and 800° C. The isolation devices can be fabricated from similar materials. Usually less expensive grades, i.e. grades which might otherwise form small cracks at the deposition conditions, of these materials can be used in the isolation devices since they do not serve to shape the product article.

The deposition process may produce the intended article as a deposit on the exterior of the mandrel, as illustrated, or it may produce the product deposit on the interior of a hollow substrate. The deposit is usually machined to its final dimensions following its removal from the mandrel. However, when it is not intended to machine the removed deposit, the surface of the article with the more critical surface dimensions is usually formed directly adjacent the substrate.

A mold release coating may advantageously be applied to the substrate surface prior to initiating the deposition, particularly when large sized articles are deposited. Amorphous, glassy or pyrolytic carbons are suitable release agents for use with graphite mandrels.

The CVD production of bulk, or free-standing, silicon carbide articles involves feeding a mixture of silicon carbide precursor gases, such as a mixture of methyltrichlorosilane (MTS) and $H_2$, with an optional inert gas, such as argon, helium or nitrogen, to the heated reactor/deposition chamber which is maintained at a pressure between about 180 and 220 torr, and at a temperature between about 1340° and 1380° C. The mandrel(s) is rotated at a speed in the range of 1 to 5 rpm. The relative partial pressure flow ratio of $H_2$/MTS is maintained in the range of about 4 to about 10. Silicon carbide is deposited on the mandrel(s) at a deposition rate of about 1.0 to about 2.0 $\mu$m/min. and is continued until the desired thickness of SiC is deposited. Any desired thickness can be produced by merely continuing the deposition for sufficient time, however, relatively thin-walled shells are generally desirable based on weight, cost and other considerations.

After the mandrel with the deposit is removed from the rotating platform, the mandrel with the deposit thereon may be cut to the required length and the outer surface of the deposit machined. The mandrel is then removed by burning the graphite. If necessary, the inside surface of the deposit can then be machined to its required specification.

EXAMPLE

Two graphite shell mandrels, fabricated from SiC-12 grade of graphite, were machined to final dimensions of 600-mm diameter and 240-mm length. They were then stacked in a CVD-furnace similar to that shown in FIG. 1. Isolation devices wherein the dimensions shown in FIG. 3 were a $w_1$ of approximately 9/16th of an inch, a height, h, of approximately one inch and a $w_2$ of approximately 3/16th of an inch. A reactive precursor gas was injected through an array of seven injectors, six equally spaced in an approx. 36 inch diameter circle and one located in the circle's center. The precursor gas mixture was provided at a flow rate through each injector of methyltrichlorosilane 4.4 standard liters per minute (slpm), $H_2$ 22 slpm, and Ar 56.5 slpm. The mandrels were rotated at a speed of 1.5 rpm and were maintained at a target temperature of 1350° C. for 90 hours. The deposits provided on the deposition zones of the two mandrels varied between 0.149 and 0.348 inches in the axial direction. The thickness variation in the radial direction was within 7%. The furnace was opened and the mandrels and isolation devices removed without introducing propagating cracks throughout the deposits. The deposits were then cut to the specification length of 240-mm and the outer surfaces machined to specification. The graphite mandrels were then removed by burning the mandrels at temperatures in the 600–800° C. range. The interior surface of a SiC shell was then machined to provide a finished shell of 600-mm diameter by 240-mm length by 3-mm wall thickness.

The invention permits the commercial fabrication of relatively dense, large-diameter, thin-walled silicon carbide cylindrical and frustroconical shells or tubes. Chemical vapor deposition techniques provide deposits of 3.15 g/cc and greater densities, which correspond to at least 98% theoretical density. Use of the isolation devices during CVD processing avoids, or at least minimizes, the formation of propagated cracks throughout the deposit which previously had precluded the preparation of hollow shells of 18 inch or larger diameters (i.e., shells having external perimeters of 60 inches or greater). As illustrated in the preceding example a shell of 24 inch diameter and 3-mm wall thickness and having an aspect ratio (shell diameter/wall thickness) of approximately 203 was prepared by this method. The invention encompasses shells of dense silicon carbide having external perimeters (i.e., circumferences) of 50 inches or greater, and particularly, those having external perimeters of 65 inches or greater; and having aspect ratios of 50 or greater; preferably, shells having aspect ratios of 100 or greater; and most preferably, those having aspect ratios of 200 or greater.

The foregoing is provided to enable workers in the art to practice the invention, and to describe what is presently considered the best mode of practicing the invention. The scope of the invention is defined by the following claims.

We claim:

1. In a process for producing a silicon carbide article by chemical vapor deposition comprising:

providing at least one silicon carbide precursor gas in proximity to a surface of a solid substrate in a deposition chamber, causing said at least one silicon carbide precursor gas to provide a silicon carbide deposit on a deposition zone on said surface of said substrate, thereafter removing said substrate with said silicon carbide deposit from said deposition chamber, and recovering said article by separating said deposit from said substrate, the improvement comprising:

providing at least one boundary zone on a portion of said surface located between said deposition zone and a proximate solid surface in said deposition chamber, said boundary zone being provided by said surface and a side portion or wall spaced from said surface creating a channel therebetween having a height greater than its width, and producing a silicon carbide deposit in said boundary zone which is substantially thinner than the deposit produced in said deposition zone, whereby said silicon carbide deposit does not extend from said surface of said substrate to said proximate solid surface in said deposition chamber.

2. The process of claim 1, wherein the thickness of said deposit produced in said boundary zone decreases as it extends away from said deposition zone.

3. The process of claim 1, wherein essentially no deposit is formed on the portion of said boundary zone which is closest to said proximate solid surface.

4. The process of claim 1, wherein an isolation device is arranged between said proximate solid surface and said substrate, and said isolation device includes a side wall which extends over said boundary zone.

5. The process of claim 4 wherein said proximate solid surface is a surface of a second solid substrate.

6. The process of claim 4, wherein said proximate solid surface supports said isolation device and said isolation device supports said substrate.

7. A process of producing a silicon carbide article, comprising:

providing at least one silicon carbide precursor gas in proximity to a deposition zone on a surface of a solid substrate in a deposition chamber, causing said at least one silicon carbide precursor gas to form a silicon carbide deposit on said deposition zone, defining a boundary zone of diminished deposit thickness on said surface adjacent said deposition zone, providing a channel overlying said boundary zone, said channel having a height greater than its width and being defined by (a) said boundary zone, (b) an outer wall spaced from and extending over said boundary zone, (c) a closed end extending between said boundary zone and said outer wall, and (d) an open end opposite said closed end and adjacent said deposition zone, and recovering said silicon carbide article by separating said silicon carbide deposit from said substrate surface.

8. The process of claim 7, wherein the width of said channel at its open end ($w_1$) is one to two times the thickness of the recovered deposit.

9. The process of claim 7, wherein the distance between the channel's open end and its closed end (h) is 1.5 to 5 times the width of said channel at its open end ($w_1$).

10. The process of claim 7, wherein the width of said channel at its open end ($w_1$) is at least twice its width at its closed end ($w_2$).

11. The process of claim 7, wherein said substrate is separated from another solid surface in said deposition chamber by an isolation device.

12. The process of claim 11, wherein said outer wall and said closed end are integral parts of said isolation device.

13. The process of claim 12, wherein said substrate is supported by said isolation device.

14. The process of claim 13, wherein said isolation device is supported by said another solid surface.

15. The process of claim 12, wherein said isolation device separates two substrates.

16. The process of claim 7, wherein said substrate extends around a hollow core.

17. The process of claim 16, wherein said substrate has a cylindrical or frustroconical shape.

18. The process of claim 16, wherein said substrate comprises a series of planar walls extending around said hollow core.

19. The process of claim 16, wherein said outer wall and said closed end are integral parts of an isolation device which separates the interior hollow core of said substrate from said precursor silicon carbide gas in said deposition chamber.

* * * * *